United States Patent
Carey

[11] Patent Number: 5,416,788
[45] Date of Patent: May 16, 1995

[54] ERROR BURST DETECTION

[75] Inventor: Michael J. Carey, Gloucestershire, England

[73] Assignee: British Telecommunications public limited company, London, England

[21] Appl. No.: 117,114

[22] Filed: Sep. 28, 1993

[30] Foreign Application Priority Data

Mar. 11, 1991 [GB] United Kingdom ............... 9105101

[51] Int. Cl.6 ............. G06F 11/00; G06F 11/10; H04L 1/00; H03M 13/12
[52] U.S. Cl. ............................ 371/45; 371/31
[58] Field of Search ............... 371/38.1, 39.1, 43, 371/44, 45; 358/167

[56] References Cited

U.S. PATENT DOCUMENTS

| 4,802,171 | 1/1989 | Rasky | 371/43 |
| 4,967,413 | 10/1990 | Otani | 371/37.4 |
| 5,233,349 | 8/1993 | Moulsley | 341/107 |

FOREIGN PATENT DOCUMENTS

| 0255065 | 2/1988 | European Pat. Off. . |
| 0332290 | 9/1989 | European Pat. Off. . |
| 0405662A2 | 1/1991 | European Pat. Off. . |
| WOA8809967 | 12/1988 | WIPO . |

Primary Examiner—Paul P. Gordon
Assistant Examiner—Emmanuel L. Moise
Attorney, Agent, or Firm—Nixon & Vanderhye

[57] ABSTRACT

A modulated signal carrying speech or other digitally coded information is demodulated and a likelihood signal $l(t)$ is produced in a Viterbi decoder for each demodulated symbol, indicating its reliability. This is used to update probabilities ($P_g(t)$, $P_b(t)$) of the transmission channel being in a relatively error-free or error-prone state, using a Viterbi algorithm, in dependence on stored parameters representing estimates of the probability transitions between the states. A decision signal $E(t)$ is generated dependent on the relative magnitudes of the probabilities $P_g(t)$, $P_b(t)$. The result may be used to inhibit the use of the affected bits, e.g. by supplying a speech decoder with parameters from an earlier speech frame.

11 Claims, 2 Drawing Sheets

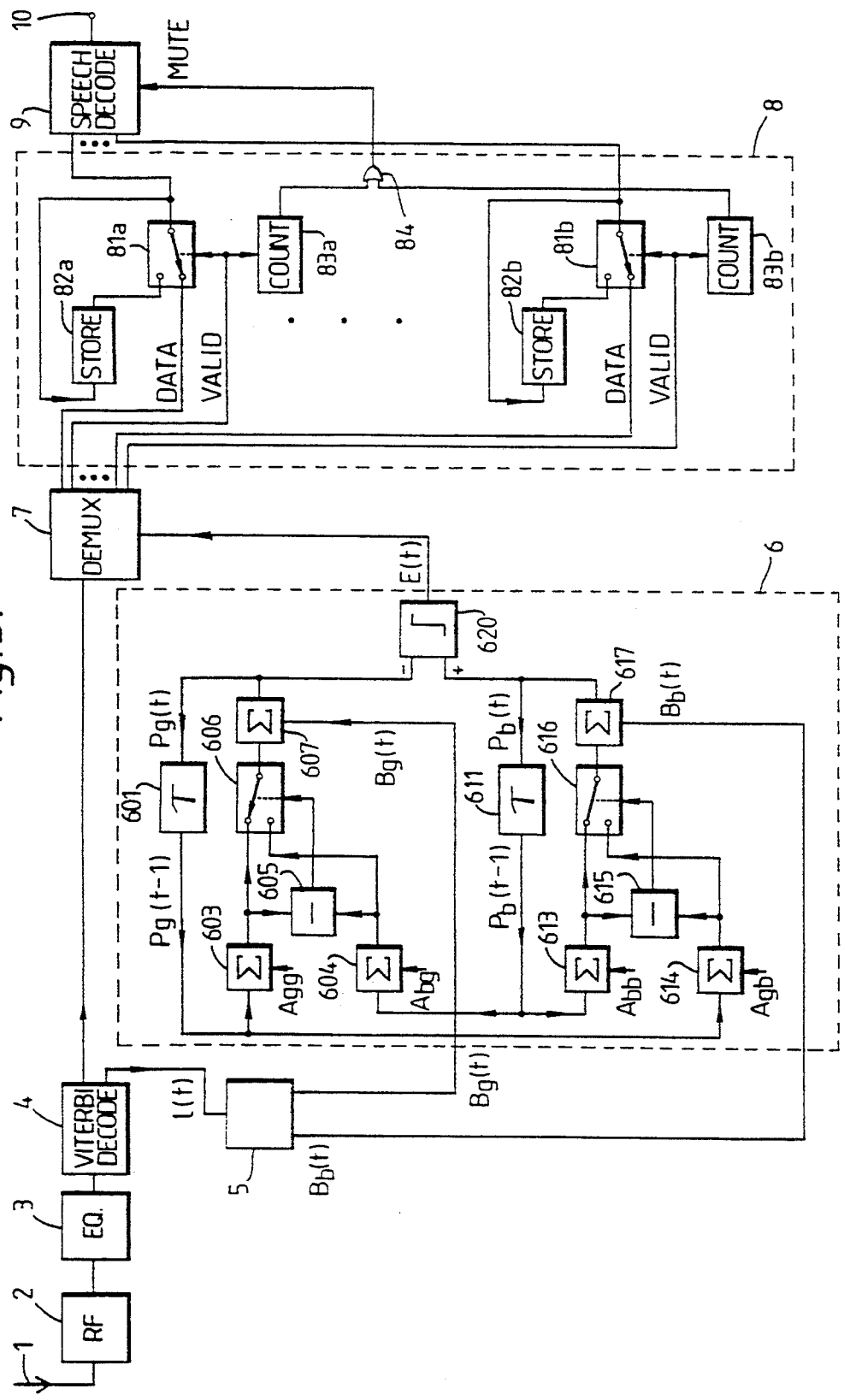

ERROR BURST DETECTION

FIELD OF THE INVENTION

The present invention is concerned with estimating the occurrence of error bursts in digitally coded information—particularly, though not exclusively, digitally coded speech.

BACKGROUND OF THE INVENTION

When data are transmitted without the use of error protection schemes such as parity bits or error correcting codes it is not possible to tell at a receiver whether any particular bit has been correctly received. If such schemes are used, error burst detection is possible but fails if the incidence of errors exceeds that which the scheme can cope with. In both cases, it is self-evident that detection of individual bit errors is not possible. However, in many types of channel the errors are correlated—i.e. errors tend to occur in bursts—and the aim of the present invention is to identify periods of reception during which there is high probability of errors having occurred; in other words, to estimate the occurrence and duration of bursts.

SUMMARY OF THE INVENTION

In one aspect, therefore, the present invention provides an apparatus for receiving over a transmission channel modulated signal carrying digitally coded signals comprising:

(a) means for demodulating the modulated signal to generate for each symbol thereof one or more bits, and for each symbol a likelihood signal indicative of the reliability or otherwise of the signal for that symbol;

(b) control means operable to receive the likelihood signals and to generate for each symbol first and second probability signals indicative of the probability of the channel being in a state which is similar to respectively, a first, relatively error-free and a second, relatively error-prone state, the first probability signal being a function of the likelihood signal, the first and second probability signals for a least one other of the symbols and first stored parameters representing an estimate of the probability of transition between states and the second probability signal being a function of the likelihood signal, the first and second probability signals for at least one other of the symbols and second stored parameters representing an estimate of the probability of transition between states;

(c) comparator means for generating in dependence on the relative magnitudes of the first and second probability signals, a decision signal indicative of the deemed state of the channel.

In another aspect of the invention there is provided an apparatus for decoding a modulated signal carrying digitally coded speech signals, comprising:

(a) means for demodulating the modulated signal to produce for a received symbol one or more bits corresponding to the deemed state of that symbol and a likelihood signal indicative of the probability that the deemed state of the symbol is correct;

(b) means for generating for the received symbol, as a function of the likelihood signals for that symbol and for other symbols, a decision signal indicating whether that symbol is deemed likely to be in error; and (c) speech decoding means operable to process only those bits which correspond to symbols not so deemed, to produce therefrom an output speech signal.

In a further aspect of the invention there is provided a method of receiving a modulated digital signal comprising:

(i) receiving a sequence of modulated symbols;

(ii) generating for each symbol a likelihood signal indicative of the reliability or otherwise of the signal for that symbol;

(iii) generating for each symbol first and second probability signals indicative of the probability of the channel being in a state which is similar to, respectively, a first, relatively error-free and a second, relatively error prone state, the first probability signal being a function of the likelihood signal, the first and second probability signals for at least one other of the symbols and first stored parameters representing an estimate of the probability of transition between states, and the second probability signal being a function of the likelihood signal, the first and second probability signals for at least one other of the symbols and second stored parameters representing an estimate of the probability of transition between states;

(iv) generating in dependence on the relative magnitudes of the first and second signals a decision signal indicative of the deemed state of the channel.

In yet another aspect the invention provides a method of decoding a modulated signal carrying a digitally coded speech signal, comprising:

(i) demodulating an input signal to produce a sequence of bits;

(ii) generating for each demodulated symbol a likelihood signal indicative of the probability of that symbol being correctly decoded;

(iii) generating for each symbol as a function of the likelihood signals for that symbol and for other symbols of the sequence, a signal indicating whether that symbol is deemed likely to be erroneously decoded; and (iv) processing only those bits of the bit sequence which are derived from symbols not so deemed, to produce therefrom an output speech signal.

Other aspects of the invention are set out in the claims.

BRIEF DESCRIPTION OF THE DRAWINGS

Some embodiments of the invention will now be described, by way of example, with reference to the accompanying drawings, in which:

FIG. 3 is a block diagram of one form of receiving apparatus according to the invention.

DETAILED DESCRIPTION OF THE DRAWINGS

This example concerns the reception of digitally coded speech. It is assumed that speech has been coded—as is usual—on a frame-by frame basis to produce a set of parameters for each frame which are then transmitted in digital form. A typical frame period is 20 ms.

The transmitted bits may be coded using an error-correcting code, may be unprotected, or some bits may be protected and others not. Bursts of error on the transmission channel commonly lead to the corruption both of protected and unprotected bits. The effect of decoding corrupted bits in a speech coder is subjectively unacceptable. It is therefore proposed to estimate the onset and termination of error bursts; corrupted parameters can then be replaced by parameters from a preceding frame; or in extreme cases the output of the decoder can be muted.

The source information for the estimation is of course the received signal. Although it is not possible to tell, for a given bit or symbol, whether an error has occurred (or, in a protected system, whether more than the detectable number of errors have occurred), it is possible to obtain an indication of the likelihood l(t) of a given bit or symbol being correct—for example, in a quadrature amplitude modulation (QAM) system, the distance in the phase plane of the received signal from the nearest point in the QAM constellation provides such an indication. The generation of the desired likelihood values can be achieved in known manner by the use of a Viterbi equaliser or a Viterbi decoder, and will therefore not be described here in further detail.

The procedure adopted for the estimation involves firstly observing, during a training sequence, the statistics of the channel; although in principle this might be the channel actually to be used, in practice it may be more convenient to conduct these tests on a channel considered to be typical and use the results for all subsequent reception. The actual observed likelihood values can then be interpreted in the light of these statistics.

Figure 1:
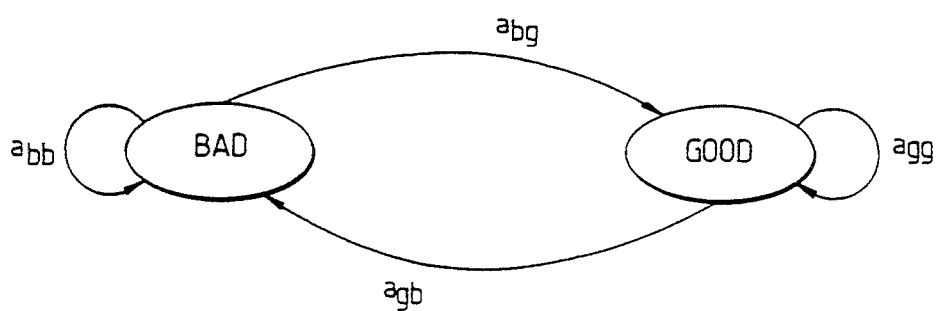
FIG. 1 shows a theoretical model of a transmission channel.

The interpretation is assisted by invoking the idea of a theoretical model of the channel characteristics. The model used in this example is the two-state Markov channel proposed by Gilbert ("Capacity of a Burst-Noise Channel", Bell Sys. Technical Journal, Sept 1960) for evaluating codes. It is supposed that one state, a good state, represents the channel in low error operation and the second, "bad", state represents the channel during error bursts. A state diagram is shown in FIG. 1. Suppose the channel is in the "good" (i.e. low error) state. A bit is transmitted by the channel with a probability $e_g$ of it being in error; the model then makes a decision as to whether to remain in the good state or make a transition to the "bad" state. This description assumes transmission of data one bit at a time, so that this decision occurs for each bit. In systems (e.g. using QAM) where a single transmitted symbol carries more than one bit, then the decision occurs once per symbol; and hence the likelihood values l(t) and error estimates referred to below are obtained once per symbol. As error bursts are infrequent, the "transition" usually made (probability $a_{gg}$) is to remain in the good state. Occasionally (probability $1-a_{gg}=a_{gb}$), however, the channel will make a transition to the "bad" state where the probability $e_b$ of errors is much higher. The model then spends one or more bit periods, as determined by transition probabilities $a_{bb}$, $a_{bg}$, in this state, generating errors with probability $e_b$, until it reverts to the good state. The transition probabilities (only two of which are independent) determine the mean duration and the frequency of the error bursts. Thus the mean duration of periods of time spent in the bad state (i.e. the mean burst length) is $$t_b = \sum_{j=0}^{\infty} a_{bb}^j = \frac{1}{1-a_{bb}} = \frac{1}{a_{bg}} \quad (1)$$

"time" here and elsewhere is expressed as the number of bit periods. Similarly the mean duration of periods between bursts is $$t_g = \frac{1}{a_{gb}} \quad (2)$$

So that the mean repetition period of bursts is $t_b - t_g$ and the frequency $$1/(t_b + t_g) = \frac{a_{gb} \, a_{bg}}{a_{gb} + a_{bg}}$$

As will be described in more detail below, the transitional probabilities a and error rates $e_g$, $e_b$ for the model are determined from a training sequence.

Once these parameters are established, the problem of interpretation of the observed likelihood values during reception of an actual transmission becomes one of correlating the behavior of the model with the observed likelihood values, to determine, at any time, which state of the model most closely models the current behavior of the channel.

Figure 2:
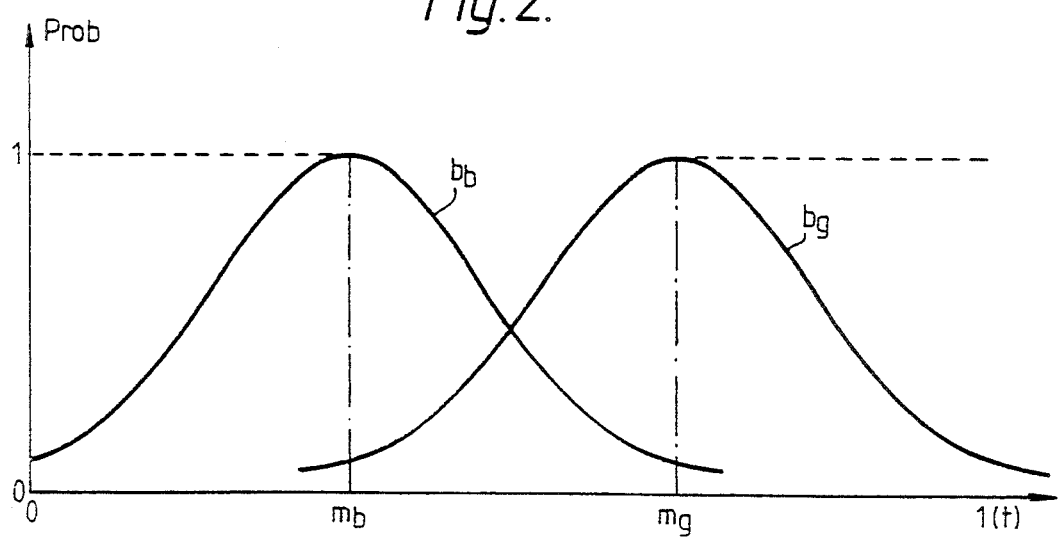
FIG. 2 illustrates graphically the relationship between probabilities b and likelihoods l.

First, the observed likelihood l(t) at time t is processed to form two observations, namely the observed probability $b_g$ or $b_b$ that the channel is in the good or the bad state respectively. If it is assumed that the channel statistics represent a normal distribution of the likelihood values about mean values $m_g$, $m_b$, with standard deviations $\sigma_g$, $\sigma_b$, then the probabilities are as shown in FIG. 2, or:

$$b_b(t) = \frac{1}{\sqrt{2\pi} \cdot \sigma_b} \exp\left( \frac{-(l(t) - m_b)^2}{\sigma_b^2} \right) \quad (3)$$

$$b_g(t) = \frac{1}{\sqrt{2\pi} \cdot \sigma_g} \exp\left( \frac{-(l(t) - m_b)^2}{\sigma_g^2} \right) \quad (4)$$

Alternatively, the <u>actual</u> statistics from the training sequence could be used to construct a look-up table for the b values instead of calculating them. As an alternative to estimating $m_g$, $\sigma_g$ etc and using equations (3) and (4) to determine $b_b(t)$ and $b_g(t)$, one could collect a histogram of probabilities. This could be done by, during a training sequence, counting, for each interval of likelihood from l to $l+\delta l$, the number of burst bits $n_b(l-l+\delta l)$ and the number of non-burst bits $n_g(l-l+\delta l)$ and computing:

$$b_g(l \to l + \delta l) = \frac{n_g(l \to l + \delta l)}{n_g(l \to l + \delta l) + n_b(l \to l + \delta l)}$$

$$b_b(l \to l + \delta l) = \frac{n_b(l \to l + \delta l)}{n_g(l \to l + \delta l) + n_b(l \to l + \delta l)}$$

the results being stored to form a look-up table. The calculation of equations (3) and (4) is then replaced by the step of looking up the values of $b_g$, $b_b$ stored in the table against the relevant likelihood range.

Although this approach provides good results it is noted that as a matter of practicality, values of the likelihood $l(t)$ less than $m_b$ or greater than $m_g$ do not in fact represent a lower probability of the bad or good state respectively than values equal to $m_b$ or $m_g$ and if desired the relation may be modified as shown by the dotted lines.

The correlation between $b_b$ and $b_g$ and the model is performed by defining probabilities $p_g(t)$, $p_b(t)$ that the model is in the good or bad state and using the Viterbi algorithm:

$$p_g(t) = \max \begin{vmatrix} p_g(t-1) \cdot a_{gg} \cdot b_g(t) \\ p_b(t-1) \cdot a_{bg} \cdot b_g(t) \end{vmatrix} \quad (5)$$

$$p_b(t) = \max \begin{vmatrix} p_b(t-1) \cdot a_{bb} \cdot b_b(t) \\ p_g(t-1) \cdot a_{gb} \cdot b_b(t) \end{vmatrix}. \quad (6)$$

In this process $p_b(0)$, $p_g(0)$ are each assumed to have the value 0.5.

Note that the sum, rather than the maximum value, of the two terms can be used instead; since one term generally dominates, the practical difference is small. Using the maximum value is much more convenient when working in the log domain. The values of $p_g(t)$ and $p_b(t)$ are then used to make a hard decision for the state at time t: if the output indicator E is 1 for the bad state and 0 for the good, then If $_g(t) > p_b(t)$ then $E=0$ \quad (7)

If $_b(t) > p_g(t)$ then $E=1$ \quad (8)

To ease computation, one may work with logarithm values instead; writing capitals for the negative log values, (i. e. $P_g = -\ln p_g$, $A_{bg} = -\ln a_{bg}$ etc) then relations (2) ... (6) become:

$$B_b(t) = \frac{(l(t) - m_b)^2}{\sigma_b^2} + \ln(\sqrt{2\pi} \cdot \sigma_b) \quad (9)$$

$$B_g(t) = \frac{(l(t) - m_g)^2}{\sigma_g^2} + \ln(\sqrt{2\pi} \cdot \sigma_g) \quad (10)$$

$$P_g(t) = \min \begin{vmatrix} P_g(t-1) + A_{gg} \\ P_b(t-1) - A_{bg} \end{vmatrix} + B_g(t) \quad (11)$$

$$P_b(t) = \min \begin{vmatrix} P_b(t-1) + A_{bb} \\ P_G(t-1) + A_{gb} \end{vmatrix} + B_b(t) \quad (12)$$

and the inequalities in relations (7) and (8) are of course reversed.

Additionally, this is a single pass algorithm; the result for the bit at time t does not take cognizance of the observed values of $l(t)$ at later times; if desired a version of the Viterbi algorithm which does so may be used.

The derivation of $a_{gg}$, $a_{bb}$, $a_{gb}$, $a_{bg}$, $m_g$, $m_b$, $\sigma_g$ and $\sigma_b$ form data obtained in a training sequence will now be described. The procedure adopted is to send data over a typical channel; on receipt, the received data are compared with the transmitted data so that erroneously received bits are identified.

Suppose that a total of n bits are sent. The received data are processed to determine which bits are deemed to have been received during an error burst (bad state) and which are received between error bursts. For this purpose it is necessary to define what constitutes an error burst, for example a burst is deemed to start with an error and finish with an error, to contain at least two errors, and to have not more than x good bits between errors; x might typically be 10. The number of bursts $n_e$ is then known, and the number of bits $n_b$ contained in those bursts can be counted. The number of bits received between bursts is $n_g = n - n_b$. The mean burst length $t_b$ is $n_b/n_e$, so from (1)

$$a_{bg} = \frac{1}{t_b} = \frac{n_e}{n_b} \quad (13)$$

and $$a_{bb} = 1 - \frac{n_e}{n_b} \quad (14)$$

The mean length between bursts is $t_g = n_g/n_e$, so from (2).

$$a_{gb} = \frac{1}{t_g} = \frac{n_e}{n_g} \quad (15)$$

and $$a_{gg} = 1 - \frac{n_e}{n_g} \quad (16)$$

Alternatively, it may be more convenient to express the error characteristics of the channel in terms of error rate. Suppose that the mean error rate for the channel is e; that in the 'good' state is $e_g$ and that in the bad state is $e_b$. We define also the probabilities $p_b$, $p_g$ of being in one state or the other at any instant ($p_b + p_g = 1$).

$$e = e_g p_g + e_b p_b = e_g p_g + e_b (1 - p_g) \; p_g(e_g - e_b) = e - e_b$$

$$p_g = \frac{e_b - e}{e_b - e_g} \; ; \; p_b = \frac{e - e_g}{e_b - e_g}$$

Thus $n_g = n p_g$ and $n_b = n p_b$ $$a_{bg} = \frac{n_e}{n_b} = \frac{n_e}{n p_b} = \frac{n_e}{n} \cdot \frac{e_b - e_g}{e - e_g} \; ;$$

$$a_{gb} = \frac{n_e}{n_g} = \frac{n_e}{n p_g} = \frac{n_e}{n} \cdot \frac{e_b - e_g}{e_b - e}$$

If $e_g$ is small compared with e and $e_b$ then, approximately $$a_{bg} = \frac{e_b \, n_e}{e \, n} \; ; \; a_{gb} = \frac{n_e}{n(1 - e/e_b)}$$

$a_{bb}$ and $a_{gg}$ follow.

To estimate $m_g$, $\sigma_g$, $m_b$ and $\sigma_b$ the following expressions may be used.

$$\left. \begin{array}{l} m_g = \frac{1}{n_g} \Sigma l(t) \\ \\ \sigma_g = \frac{1}{n_g} \Sigma (l(t) - m_g)^2 \end{array} \right\} \begin{array}{l} \text{summed for all the bits} \\ \text{received between bursts} \end{array} \quad (17)$$

$$m_b = \frac{1}{n_b} \Sigma l(t) \quad \left.\begin{array}{l}\end{array}\right\} \text{Summed for all the bits} \quad (18)$$
$$\sigma_b = \frac{1}{n_b} \Sigma(l(t) - m_b)^2 \quad \left.\begin{array}{l}\end{array}\right\} \text{received during bursts}$$

Alternatively, assuming that the likelihoods observed when there is no error and an error respectively are good approximations to those during burst and non burst periods, one may use:

$$m_g = \frac{1}{n_c} \Sigma l(t) \quad \left.\begin{array}{l}\end{array}\right\} \text{Summed for all the bits received without error,} \quad (19)$$
$$\sigma_g = \frac{1}{n_c} \Sigma(l(t) - m_g)^2 \quad \left.\begin{array}{l}\end{array}\right\} \text{where } n_c \text{ is the number of correctly received bits.}$$

$$m_b = \frac{1}{n_i} \Sigma l(t) \quad \left.\begin{array}{l}\end{array}\right\} \text{Summed for all the bits received in error,} \quad (20)$$
$$\sigma_b = \frac{1}{n_i} \Sigma(l(t) - m_b)^2 \quad \left.\begin{array}{l}\end{array}\right\} \text{where } n_i \text{ is the number of incorrectly received bits.}$$

Derivation of $a_{gg}$, $a_{gb}$, $a_{bb}$, $a_{bg}$, $M_g$, $\sigma_g$, $M_b$, $\sigma_b$ has been described and provides a set of parameters. However it may be appropriate to adjust these parameters to achieve desired characteristics. For example, there is clearly a trade-off between identifying an error burst where there is none, and failing to identify a burst which has occurred; for a speech system one might well wish to bias the characteristics towards the former.

Thus the parameters may be optimised by making small adjustments to each of the independent values in turn and observing the effect during a test sequence.

FIG. 3 is a block diagram of a receiver for digital speech signals transmitted over a radio link. Signals received at an antenna 1 pass via RF and demodulator circuits 2 and equaliser 3 to a Viterbi soft-decision decoder 4. The latter has an output for decoded bits and a second output providing the likelihood value l(t) for each bit (alternatively if the unit 2 is a Viterbi equaliser, this could produce the likelihood values). The likelihood values are used to address a look-up table 5 which contains stored values as defined by the graphs of FIG. 2; these being read out to provide log values $B_g(t)$, $B_b(t)$.

A calculation unit 6 receives these values and calculates probability values $P_g(t)$, $P_b(t)$ in accordance with relations (11) and (12) above.

One bit-period delay lines 601, 611 provide the previous bit log probabilities $P_g(t-1)$, $P_b(t-1)$ respectively, to which are added the log transition probabilities $A_{gg}$, $A_{bg}$ respectively by adders 603 and 604. The two sums are compared in a comparator 605 which controls an electronic changeover switch 606 to select the smaller of the two sums, which is then added to $B_g(t)$ (from the store 5) in a further adder 607. The output of this adder represents the current bit log probability $P_g(t)$. Similarly adders 613, 614, 617, a comparator 615 and a switch 616 serve to obtain the log probability $P_b(t)$ in accordance with relation (12). The two values $P_g(t)$, $P_b(t)$ are conducted to the inputs of the delays 601, 611 to provide feedback for the next bit and also to a comparator 620 whose output E assumes the value 1 whenever $P_b(t) \geq P_g(t)$ and zero otherwise.

A demultiplexer 7 receives the data output from the Viterbi decoder 4 and formats the received bits into outputs representing the coded speech parameters for a speech frame. It also receives the single bit burst estimates E from the calculator 6 and appends a validation bit to each parameter which, if set, indicates that one more bits (or, optionally one or more of the more significant bits) of that parameter are judged (i.e. E=1) to have a high probability of being in error.

The output data from the demultiplexer pass to a selection unit 8 which has for each speech parameter an electronic changeover switch 81a, 81b etc. and a store 82a, 82b etc. Operation will be described for one parameter, that for other parameters being identical. Normally, each speech frame period, the switch 81a selects, for output, the received speech parameter from the demultiplexer 7. If, however the validation bit is set the switch instead rejects the parameter and substitutes the corresponding parameter from a preceding frame from the store 82a. The output of the switch 81a is fed back to the input of the store 82a so that either the new (valid) parameter or the previous store contents are entered into the store ready for the next frame. In this way the store always contains the most recent validly received value for the parameter in question. The parameters, after substitution are supplied from the outputs of the switches 81a, 81b etc to a speech decoder 9 which decodes the parameters to produce a speech signal at an output 10.

In order to avoid undesirable effects due to substitution (in the event of a sustained error burst) of parameters from extremely old frames, counters 83a, 83b etc may be included to count the number of successive set validation bits for each parameter; the counter produces an active output whenever the current and T-1 immediately preceding validation bits are set, where T is some threshold number of frames (e.g. 5). Whenever any counter produces an active output, a signal (via an or-gate 84) is conducted to the speech decoder to mute its output as long as this condition persists.

Although the apparatus has been described in terms of dedicated hardware, it will of course be appreciated that many of the functions may be performed by programmable LSI devices.

Finally, it should be noted that, although the above example employs a two-state model, models with more than two states are also possible. For example a three-state model might have states corresponding to (i) a relatively error-free channel;
(ii) a relatively error-prone channel; and
(iii) no signal being received.

The third state might arise where (for example) a mobile radio receiver enters a tunnel and the output of the speech decoder would be muted.

I claim:

1. An apparatus for receiving over a transmission channel a modulated signal carrying digitally coded signals comprising:
   (a) means for demodulating the modulated signal to generate for each symbol thereof one or more bits and a likelihood signal (l(t)) indicative of the reliability or otherwise of the signal for that symbol;
   (b) control means operable to receive a likelihood signal (l(t)) and to generate for the corresponding symbol first ($P_g(t)$) and second ($P_b(t)$) probability signals indicative of the probability of the channel being in a state which is similar to, respectively, a first relatively error-free and a second, relatively error-prone state, the first probability signal ($P_g(t)$)

being a function of the likelihood signal (1(t)), the first and second probability signals for at least another symbol ($P_g(t-1)$, $P_b(t-1)$) and first stored parameters ($A_{gg}$, $A_{bg}$) representing an estimate of a probability of transition between states, and the second probability signal ($P_b(t)$) being a function of the likelihood signal (1(t)), the first and second probability signals for at least the another symbol ($P_g(t-1)$, $P_b(t-1)$) and second stored parameters ($B_{bb}$, $B_{gb}$) representing an estimate of a probability of transition between states; and (c) comparator means for generating in dependence on the relative magnitudes of the first and second probability signals, a decision signal (E(t)) indicative of a deemed state of the channel.

2. An apparatus according to claim 1 in which the demodulating means includes a Viterbi equalizer, the equaliser being arranged to produce the likelihood signal.

3. An apparatus according to claim 1 in which, for transmission employing an error-correcting code, the demodulating means includes a Viterbi decoder, the Viterbi decoder being arranged to produce the likelihood signal (1(t)).

4. An apparatus according to claim 1 in which the control means is operable to produce from the likelihood signal first ($B_g(t)$) and second ($B_b(t)$) derived signals, for use in determining the first and second probability signals respectively, which derived signals represent the probabilities of the instantaneous value of the likelihood signal being associated with, respectively, the first relatively error-free and second relatively error-prone states.

5. An apparatus according to claim 4 in which the control means is operable to produce the derived signals ($B_g(t)$, $B_b(t)$) by means of a look-up table.

6. An apparatus according to claim 5 in which the control means is operable to produce the derived signals ($B_g(t)$, $B_b(t)$) by calculation as a function of a difference between the likelihood signal (1(t)) and respective stored parameters representing typical likelihood values for the states.

7. An apparatus according to claim 4 in which the control means is operable to generate the first and second probability signals from the derived signals by means of a Viterbi algorithm.

8. An apparatus according to claim 1 wherein the digitally coded signals are digitally coded speech signals comprising successive time frames containing speech parameters, said apparatus further comprising a digital speech decoder, the speech decoder including means to store parameters and being responsive to the decision signal (E(t)) indicating the second relatively error-prone state to substitute for a parameter, one or more bits of which are thereby indicated as being in error, a stored parameter from an earlier frame.

9. An apparatus according to claim 1 further including speech decoding means arranged to process only those bits which correspond to symbols indicated by the decision signal as having been received under the first relatively error-free state, and to produce therefrom an output speech signal.

10. A method of receiving modulated digital signals over a transmission channel comprising:

(i) receiving a sequence of modulated symbols;

(ii) generating for each symbol a likelihood signal indicative of the reliability or otherwise of the signal for that symbol;

(iii) generating for each symbol first and second probability signals indicative of the probability of the channel being in a state which is similar to, respectively, a first, relatively error-free and a second, relatively error-prone state, the first probability signal being a function of the likelihood signal, the first and second probability signals for at least another symbol and first stored parameters representing an estimate of a probability of transition between states, and the second probability signal being a function of the likelihood signal, the first and second probability signals for at least the another symbol and second stored parameters representing an estimate of a probability of transition between states;

(iv) generating in dependence on the relative magnitudes of the first and second signals a decision signal indicative of a deemed state of the channel.

11. An method according to claim 10 wherein the digital signals are digitally coded speech signals and said method further comprises:

decoding only those bits which correspond to symbols indicated by the decision signal as having been received under the first relatively error-free state, and producing from the decoding an output speech signal.

* * * * *